(12) United States Patent
Song et al.

(10) Patent No.: US 6,808,975 B2
(45) Date of Patent: Oct. 26, 2004

(54) METHOD FOR FORMING A SELF-ALIGNED CONTACT HOLE IN A SEMICONDUCTOR DEVICE

(75) Inventors: Jong-Heui Song, Suwon-si (KR); Jun Seo, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/608,122

(22) Filed: Jun. 30, 2003

(65) Prior Publication Data

US 2004/0005786 A1 Jan. 8, 2004

(30) Foreign Application Priority Data

Jul. 6, 2002 (KR) ........................................ 2002-39138

(51) Int. Cl.$^7$ .......................................... H01L 21/8238
(52) U.S. Cl. ...................... 438/233; 438/533; 438/586; 438/597; 438/618; 438/621; 438/639; 438/666; 438/672; 438/700; 438/702; 438/740; 438/902; 438/976
(58) Field of Search ................................ 438/233, 533, 438/586, 597, 618, 621, 639, 666, 672, 700, 702, 740, 902, 976

(56) References Cited

U.S. PATENT DOCUMENTS 6,380,042 B1 * 4/2002 Huang ........................ 438/666
6,635,536 B2 * 10/2003 Shin et al. ................... 438/276
2001/0055867 A1  12/2001 Lee et al.
2004/0018707 A1 * 1/2004 Terauchi ..................... 438/586

* cited by examiner

Primary Examiner—Lynne A. Gurley
(74) Attorney, Agent, or Firm—Lee & Sterba, P.C.

(57) ABSTRACT

A method for forming a self-aligned contact hole includes forming a plurality of conductive structures on a semiconductor substrate, each conductive structure including a conductive film pattern and a protection pattern formed on the conductive film pattern, forming a first insulation film to fill a space between adjacent conductive structures, successively etching the first insulation film and the protection patterns until each of the protection patterns has an exposed level upper surface, forming a second insulation film on the resultant structure, and selectively etching portions of the second insulation film and the first insulation film using a photolithography process to form the self-aligned contact hole exposing a portion of the semiconductor substrate between adjacent conductive structures. Process failures generated during formation of a self-aligned contact hole can thus be prevented because a nitride pattern capping a conductive film pattern remains, thereby enhancing reliability and yield of a semiconductor device.

29 Claims, 18 Drawing Sheets

METHOD FOR FORMING A SELF-ALIGNED CONTACT HOLE IN A SEMICONDUCTOR DEVICE

BACKGROUND OF THE INVENTION

1. Field of the Invention

The present invention relates to a method for forming a self-aligned contact hole. More particularly, the present invention relates to a method for forming contact holes between closely disposed conductive structures on a substrate using a self-aligning process.

2. Description of the Related Art

As semiconductor devices become more highly integrated and are required to have higher response speeds, patterns formed on a substrate must become increasingly minute. More particularly, a width of a pattern and a space between adjacent patterns are being greatly reduced. Specifically, since a contact should be formed to connect isolated devices on a semiconductor substrate to a highly conductive film, while an aligning margin and an isolation margin are maintained, the contact occupies a significant area on the semiconductor substrate. Accordingly, dimensions of the contact greatly affect the overall size of a memory device in which identical cells are repeatedly formed, such as a dynamic random access memory (DRAM), a static random access memory (SRAM) or a non-volatile memory (NVM).

Recently, a contact having a minute size has not been able to be exactly formed using conventional semiconductor manufacturing methods even though the semiconductor technology has been rapidly developed to form a line width of below approximately 0.25 μm. In addition, heights of conductive film patterns have increased in order to reduce resistances of the conductive film patterns as widths of the conductive film patterns have decreased. As a result, formation of a contact between the conductive film patterns becomes increasingly difficult. Hence, in a case that a design rule does not have a sufficient margin and patterns having identical shapes are repeatedly formed, such as in a memory device, a method for forming a contact hole using a self-aligning process has been developed to reduce the overall area of the device.

FIGS. 1A to 1E illustrate cross-sectional views of stages in a conventional method for forming a self-aligned contact hole.

Referring to FIG. 1A, after a conductive film is formed on a substrate 10, a nitride film is formed on the conductive film. Then, portions of the nitride film and the conductive film are etched to expose the substrate 10 so that conductive structures 15 including conductive film patterns 12 and nitride film patterns 14 are formed on the substrate 10.

Referring to FIG. 1B, a nitride film is uniformly formed on the conductive structures 15 and on the substrate 10. The nitride film is then anisotropically etched so that the nitride film remains at sidewall portions of the conductive structures 15, thereby forming nitride spacers 16. Here, upper portions of the nitride film patterns 14 on the conductive film patterns 12 are partially etched while the nitride film on the substrate 10 is completely removed. Thus, the upper portions of the nitride film patterns 14a have rounded shapes.

Referring to FIG. 1C, an insulation film 18 including silicon oxide is formed to fill a space between the conductive structures 15 including the nitride spacers 16.

Referring to FIG. 1D, using an anisotropic etching process having an etching selectivity between silicon oxide and silicon nitride, a predetermined portion of the insulation film 18 is etched to form a preliminary contact hole exposing a portion of the substrate 10 between the conductive structures 15 including the nitride spacers 16a. When the insulation film 18 is etched to expose the portion of the substrate 10 between the conductive structures 15 having the nitride spacers 16, an upper portion of the nitride spacers 16a is etched in accordance with a ratio corresponding to the etching selectivity.

Referring to FIG. 1E, the substrate 10 and the resultant structures formed thereon are rinsed with a rinsing chemical to remove polymers generated during the etching so that self-aligned contact holes 20 are formed. When the substrate 10 is rinsed, an exposed portion of the etched insulation film 18a is partially etched.

As the patterns become much smaller to meet demand of high integration of semiconductor devices, several disadvantages of this conventional method for forming the self-aligned contact hole become apparent.

First, a thickness of the nitride spacer 16 should be reduced so that a space between the conductive structures 15 may be significantly decreased. When the nitride spacer 16 has a relatively large thickness, the space between the conductive structures 15 becomes so narrow that the insulation film 18 may not be able to completely fill in the space. In addition, a parasitic capacitance may be increased due to the nitride spacer 16. Alternately, when the thickness of the nitride spacer 16 decreases, the conductive film pattern 12 covered by the nitride spacer 16 may be easily exposed because the nitride spacer 16 may be consumed during formation of the self-aligned contact hole 20. As a result, a bridge failure frequently occurs between the conductive film pattern 12 and conductive materials filling the self-aligned contact hole 20.

Second, upper side, or "shoulder," portions of the nitride spacers 16a become increasingly rounded as widths of the conductive structures 15 decrease. When the shoulder portions of the nitride spacers 16a have more rounded shapes, predetermined portions of the nitride spacers 16 and the nitride film patterns 14a are rapidly etched during the formation of the self-aligned contact hole 20, so the conductive film patterns 12 covered by the nitride spacers 16 may be exposed.

Third, a depth of the contact hole 20 necessarily increases as the heights of the conductive structures 15 increase. Thus, a process failure such as a non-opening of a contact may increase.

Fourth, a remaining portion of the etched insulation film 18a on the nitride spacer 16 significantly decreases as the space between adjacent conductive structures 15 decreases. Further, the remaining portion of the etched insulation film 18a may be completely removed during subsequent processes. Hence, a process failure frequently occurs wherein the conductive materials filling the contact holes 20 are connected to each other during the subsequent processes.

SUMMARY OF THE INVENTION

The present invention has been made in an effort to solve the aforementioned problems and accordingly, it is a feature of an embodiment of the present invention to provide a method of forming a self-aligned contact hole that is able to minimize process failures.

In order to provide this feature of an embodiment of the present invention, there is provided a method for forming a self-aligned contact hole including (a) forming a plurality of conductive structures on a semiconductor substrate, each conductive structure including a conductive film pattern having an upper and side surfaces and a protection pattern formed on the upper and surfaces of the conductive film pattern; (b) forming a first insulation film to fill a space between adjacent conductive structures; (c) successively etching upper portions of the first insulation film and the protection patterns until each of the protection patterns has a level upper surface that is exposed; (d) forming a second insulation film on the resultant structure on the semiconductor substrate; and (e) selectively etching portions of the second insulation film and the first insulation film using a photolithography process to form the self-aligned contact hole exposing a portion of the semiconductor substrate between adjacent conductive structures.

In one embodiment of the present invention, the successive etching results in the first insulation film being etched slower than the protection pattern so that a portion of the first insulation film filled between adjacent conductive structures protrudes from the upper surface of the conductive structures.

The method of the present invention may further include forming a nitride liner on the plurality of conductive structures and on the semiconductor substrate after forming the plurality of conductive structures. In addition, the method preferably includes forming a conductive material in the self-aligned contact hole to form a contact.

According to the present invention, a process failure, such as a non-opening of the contact, may be prevented because protection patterns have level upper surfaces, and the protection patterns have heights lower than conventional protection patterns. In addition, consumption of the protection patterns may be reduced during etching to form a contact hole because an etching selectivity between the protection pattern and the first and second insulation films is enhanced.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Figure 1A:
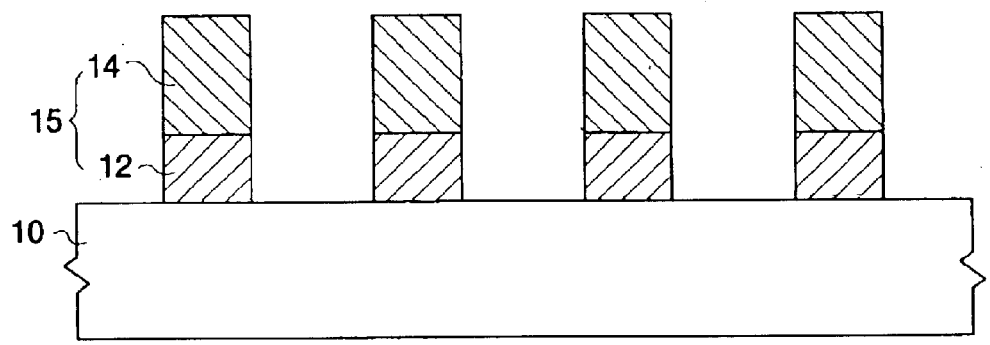
FIGS. 1A to 1E illustrate cross-sectional views of stages in a conventional method for forming a self-aligned contact hole of a semiconductor device.
Figure 1B:
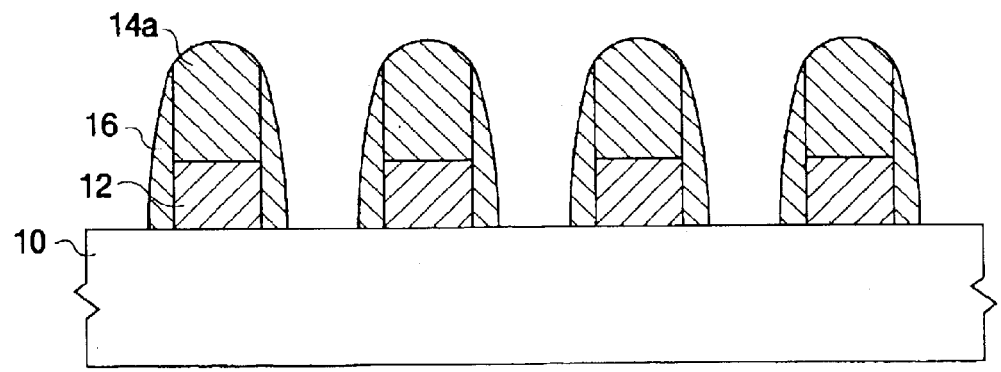

Korean Patent Application No. 2002-39138, filed on Jul. 6, 2002, and entitled: "Method for Forming a Self-Aligned Contact Hole in a Semiconductor Device," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like numbers refer to like elements throughout.

First Embodiment

FIGS. 2A to 2H illustrate cross-sectional views of stages in a method for forming a self-aligned contact of a semiconductor device according to a first embodiment of the present invention. In the first embodiment, a self-aligned contact represents a contact formed between gate electrodes in order to make contact with a source region or a drain region.

Figure 2A:
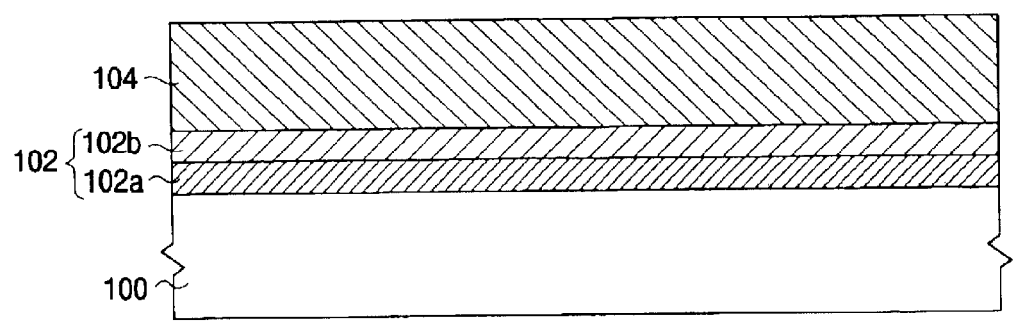
FIGS. 2A to 2H illustrate cross-sectional views of stages in a method for forming a self-aligned contact hole of a semiconductor device according to a first embodiment of the present invention.

Referring to FIG. 2A, a semiconductor substrate 100 is divided into an active region and a field region by forming a field oxide film (not shown) on the substrate 100. The field oxide film may be formed through an isolation process, such as an improved local oxidation of silicon (LOCOS) process or a trench field isolation process.

Then, a conductive film 102 used for a gate electrode is formed on a gate oxide film (not shown) after the gate oxide film having a thickness of approximately 30 to 100 Å is formed on the semiconductor substrate 100. The conductive film 102 has a polycide structure in which a polysilicon film 102a doped with an impurity having a high concentration is formed on the gate oxide film, and a metal silicide film 102b, preferably a tungsten silicide film, having a thickness of approximately 1,500 Å is formed on the polysilicon film 102a. The polysilicon film 102a having a thickness of approximately 1,000 Å is generally formed using a doping process, such as a diffusion process, an ion implantation process or an in-situ doping process.

Subsequently, a first silicon nitride film 104 is formed on the conductive film 102 to have a thickness of approximately 1,800 to 2,000 Å. The first silicon nitride film 104 functions as a hard mask when the conductive film 102 is etched in a successive process. In addition, the first silicon nitride film 104 protects the conductive film 102 so that the conductive film 102 is not exposed when successive processes are performed. As an alternative, instead of a first silicon nitride film 104, any film having an etching selectivity with respect to silicon oxide may be formed on the conductive film 102 under a specific etching process.

Figure 2B:
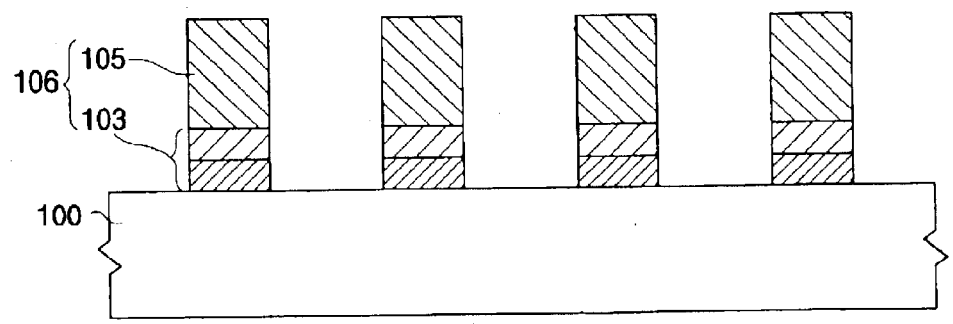

Referring to FIG. 2B, predetermined portions of the first silicon nitride film 104, the conductive film 102 and the gate oxide film are successively etched to form gate structures 106 each including a gate oxide film pattern (not shown), a conductive film pattern 103 and a first silicon nitride film pattern 105. Subsequently, impurities are implanted into the active region of the semiconductor substrate 100 using the gate structures 106 as a mask, thereby forming a source/drain region (not shown) in the active region. Each of the resultant gate structures has a thickness that is greater than approximately 4000 Å.

Figure 2C:
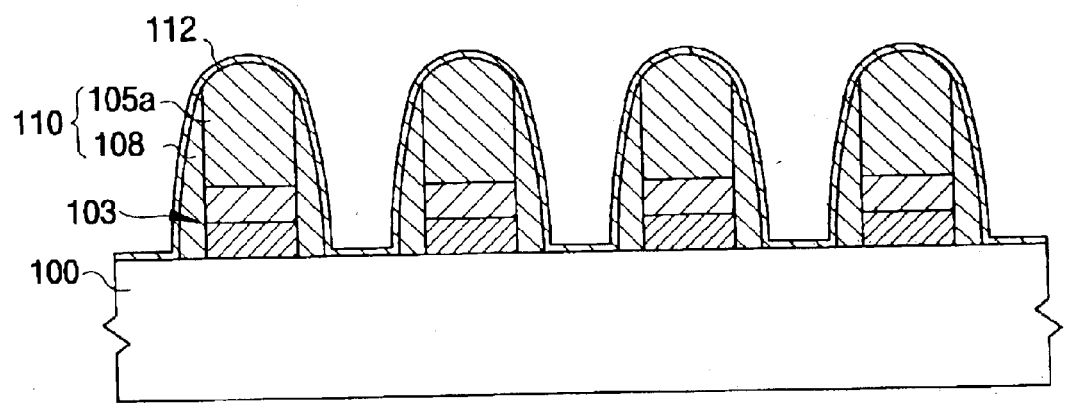

Referring to FIG. 2C, a second silicon nitride film (not shown) having a thickness of approximately 1,300 Å is uniformly formed on the gate structures 106 and the semiconductor substrate 100. Subsequently, the second silicon nitride film is anisotropically etched so that the second silicon nitride film remains at a side portion of the gate structures 106. Thus, a nitride spacer 108 is formed at the side portion of the gate structures 106. As the second silicon nitride film formed on a surface of the semiconductor substrate 100 is completely removed when the second silicon nitride film is anisotropically etched, portions of the second silicon nitride film on the gate structures 106 are also completely removed. In addition, an upper portion of the first silicon nitride film pattern 105a formed on the conductive film pattern 103 is partially etched. Particularly, an upper edge portion of the first silicon nitride film pattern 105a is more etched than an upper central portion of the first silicon nitride film pattern 105a, so an upper surface of the first silicon nitride film pattern 105 has a rounded shape in a sectional view, as shown in FIG. 2C.

According to the above-described processes, an upper surface and a side surface of the conductive film pattern 103 functioning as the gate electrode are capped with the first silicon nitride film pattern 105a.

Hereinafter, it will be described that a second silicon nitride pattern 110 includes the nitride spacer 108 and the rounded first silicon nitride film pattern 105a capping the conductive film pattern 103.

As the integration density of the semiconductor devices greatly increases, the width of the gate electrode becomes significantly smaller. In addition, a space between adjacent gate electrodes is significantly reduced. In particular, a width of the gate structures 106 is reduced to below approximately 2500 Å, and also a space between adjacent gate structures 106 is decreased to below approximately 1500 Å. In a case that the gate structures 106 have such a small dimension, a boundary portion (that is, the shoulder portion) between an upper surface and a side surface of the second silicon nitride pattern 110 has an increasingly rounded shape. When the shoulder portion of the second silicon nitride pattern 110 has an increasingly rounded shape, the etching selectivity between the silicon nitride film and the silicon oxide film is reduced at the shoulder portion. That is, the conductive film pattern 103 may be exposed because the silicon nitride at the shoulder portion, as well as the silicon oxide, are rapidly etched under an etching condition for selectively etching the silicon oxide.

Subsequently, a nitride liner 112 having a thickness of approximately 50 to 300 Å is formed on the resultant structure. The nitride liner 112 functions as an etching stop layer during a successive process.

Figure 2D:
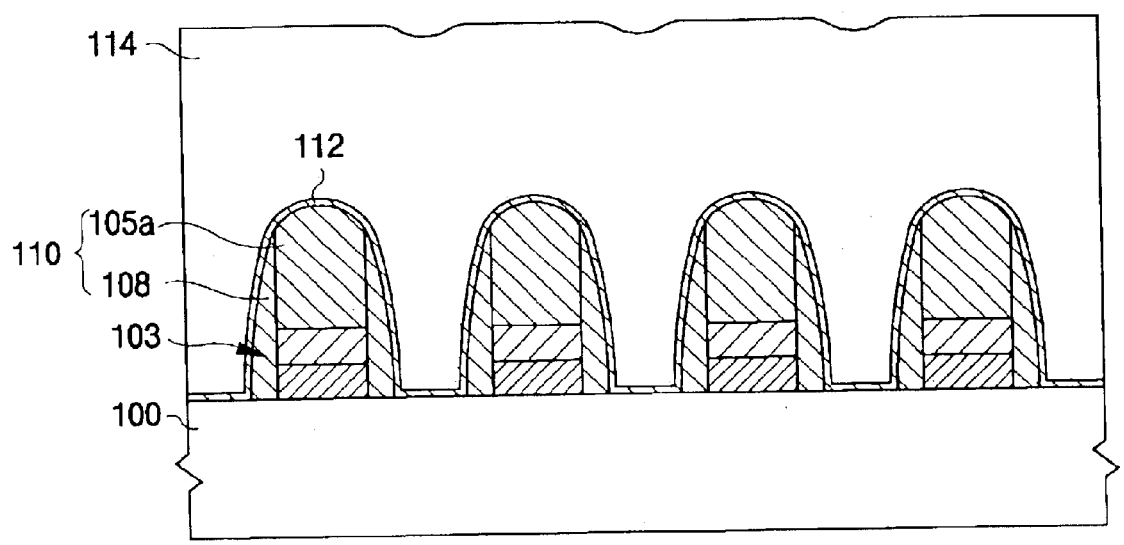

Referring to FIG. 2D, a first insulation film 114 is formed on the semiconductor substrate 100 to cover the conductive pattern 103 capped with the second silicon nitride pattern 110. As each of the resultant structures, including the conductive film pattern 103 and the second silicon nitride pattern 110, has a relatively large height of approximately 5,000 Å and an interval between adjacent resultant structures has a relatively small value of below approximately 1,000 Å, it is difficult for the first insulation film 114 to completely fill the space between adjacent resultant structures. Hence, the first insulation film 114 is formed using an oxide having a good reflow-ability, such as boro-phosphor silicate glass (BPSG), undoped silicate glass (USG) or spin-on glass (SOG) in order to fill a gap between adjacent resultant structures.

Figure 2E:
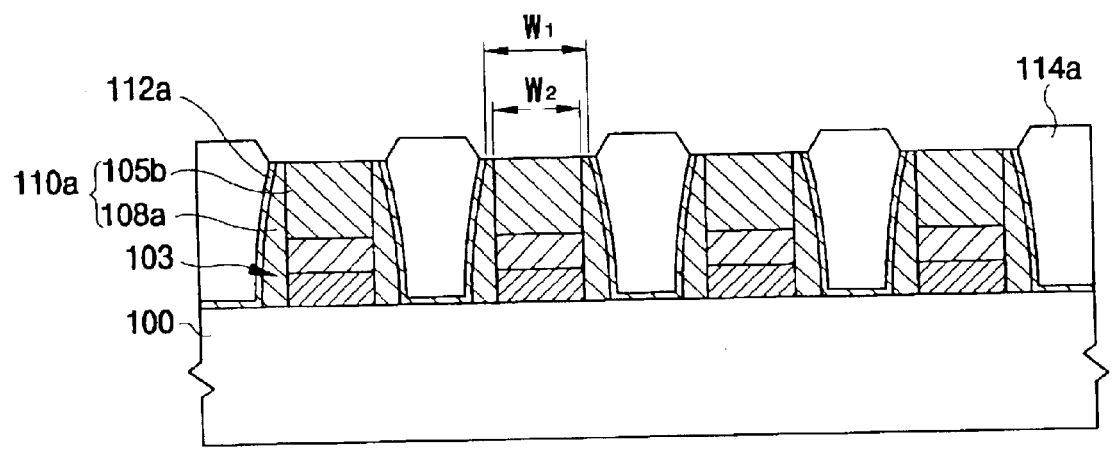

Referring to FIG. 2E, upper portions of the first insulation film 114 and the second silicon nitride film pattern 110 are successively etched so that the etched second silicon nitride film pattern 110a has a level upper surface. At that time, the etched first insulation film 114a is higher than the etched second silicon nitride film pattern 110a. That is, portions of the etched first insulation films 114a protrude from between portions of the etched second silicon nitride film pattern 110a.

The first insulation film 114 and the second silicon nitride film pattern 110 may be etched using a dry etching process or a chemical-mechanical polishing process. In the drying etching process, the etching is performed so that the second silicon nitride film pattern 110 is etched more rapidly than the first insulation film 114. Preferably, an etching ratio between the first insulation film 114 and the second silicon nitride film pattern 110 is about 1:1–1:1.5. When a greater amount of the second silicon nitride film pattern 110 is etched as compared to the first insulation film 114, the second silicon nitride film pattern 110 may be over-etched so that a processing margin may be insufficient. In addition, when an etching rate of the first insulation film 114 is slower than that of the second silicon nitride film pattern 110, the time for etching the first insulation film 114 increases. As a result of the above-described dry etching process, portions of the etched first insulation film 114a protrude from the portions of the etched second silicon nitride film pattern 110a.

Alternately, a chemical-mechanical polishing process may be performed using a slurry for removing silicon nitride more rapidly than silicon oxide. Similar to the above dry etching process, the etching ratio between the first insulation film 114 and the second silicon nitride film pattern 110 is about 1:1–1:1.5 in the chemical-mechanical polishing process.

When the second silicon nitride film pattern 110 is etched to have a level upper surface, portions of the first insulation film 114 remain having heights higher than those of portions of the etched second silicon nitride film pattern 110a at peripheral portions of the etched second silicon nitride film pattern 110a. As a result, side portions of the etched second silicon nitride film pattern 110a are not exposed during the etching process forming the etched second silicon nitride film pattern 110a. Hence, side portions of the second silicon nitride film pattern 110a, which protect lateral portions of the conductive film pattern 103, are not etched during the etching process. Subsequent to this etching process, the etched second silicon nitride pattern 110a includes an etched nitride spacer 108a and an etched first silicon nitride film pattern 105b capping the conductive film pattern 103. In addition, during this etching process the nitride liner 112 is etched to have a level upper surface thereby forming an etched nitride liner 112a.

If upper portions of the first, insulation film 114 and the second silicon nitride film pattern 110 are etched so that the second silicon nitride film pattern 110a has a level lower surface, portions of the first insulation film 114a are partially removed between the second silicon nitride film patterns 110a during the etching process. In addition, side portions of the second silicon nitride film pattern 110a are exposed, and then the side portions of the second silicon nitride film pattern 110a are partially removed as the portions of the first insulation film 114a are removed between the second silicon nitride film patterns 110a. As a result, the conductive film pattern 103 may not be capped with the second silicon nitride film pattern 110a because the second silicon nitride film pattern 110a is over-etched.

Accordingly, the etching process is preferably performed so that a width of the upper surface of the etched second silicon nitride film pattern 110a (W1) on the conductive pattern 103 is wider than that of an upper surface of the conductive pattern 103 (W2). In addition, a thickness of more than approximately 500 Å of the second silicon nitride film pattern 110a is preferably removed during the etching process. Thus, the shoulder portion of the second silicon nitride film pattern 110a is no longer rounded, and the overall height of the second silicon nitride film pattern 110a is reduced.

Figure 2F:
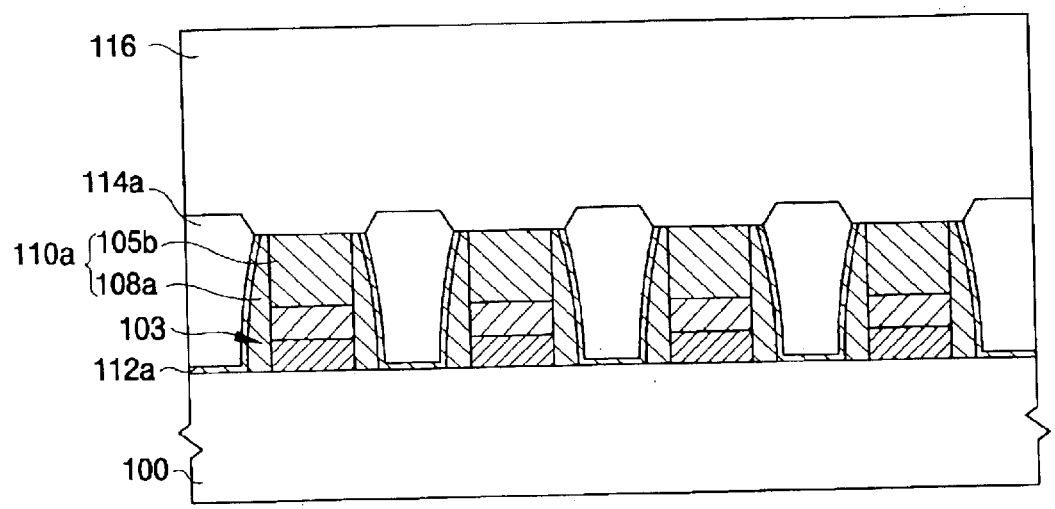

Referring to FIG. 2F, a second insulation film 116 is formed on the resultant structure including the etched second silicon nitride film pattern 110a having the level upper surface.

Since the etched first insulation film 114a includes silicon oxide having a good reflow-ability, and since the etched first insulation film 114a is filled in a space between the etched second silicon nitride film pattern 110a, the second insulation film 116 does not need to be formed using a material having a good reflow-ability since the second insulating film 116 is formed on a planarized surface. Hence, the second insulation film 116 is formed with a material comprised of tightly bonded atoms to protect the insulation films during successive processes. In particular, the atoms of the second insulation film 116 have tighter bonds that the atoms of the first insulation film 114.

More specifically, because the etched first and the second insulation films 114a and 116 may be primarily damaged during a rinsing process and the etched first and the second insulation films 114a and 116 are undesirably etched by a rinsing chemical, an etching failure may occur due to the rinsing chemical. Considering this problem, the second insulation film 116 is formed to have an etching rate slower than that of the first insulation film 114a. That is, the second insulation film 116 can be formed using a material different from the material of the first insulation film 114a, or the second insulation film 116 can be formed through a process different from that of the first insulation film 114a. In particular, when the first insulation film 114 is comprised of BPSG, the second insulation film 116 may be composed of BPSG including boron (B) and phosphorus (P) ion concentrations lower than the concentrations of boron and phosphorous in the first insulation film 114. Alternatively, the second insulation film 116 may be formed by a high-density plasma chemical vapor deposition process or a plasma-enhanced chemical vapor deposition process.

Figure 2G:
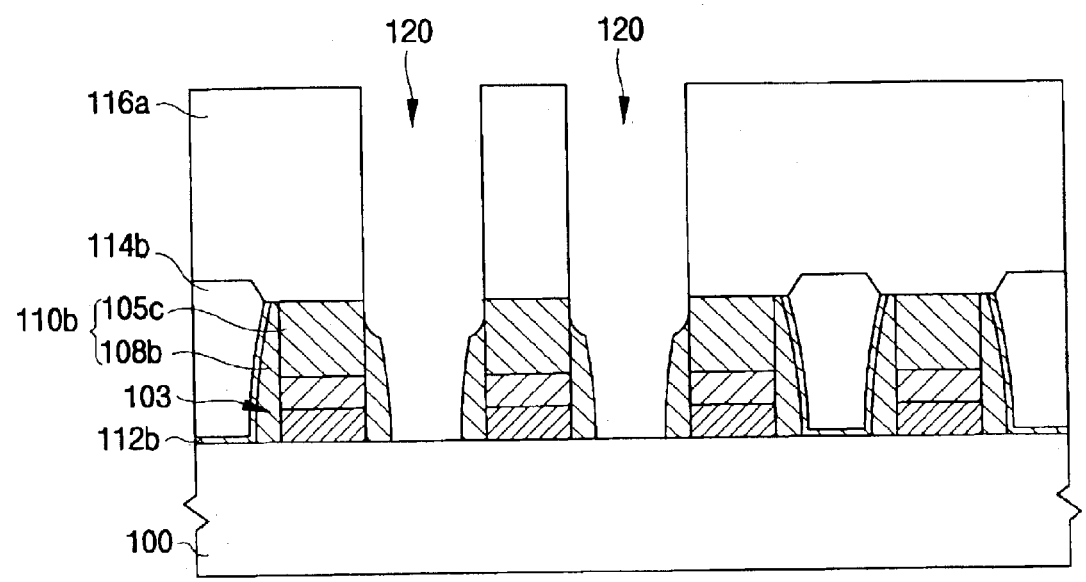

Referring to FIG. 2G, portions of the second and the first insulation films 116 and 114a are etched to expose portions of the semiconductor substrate 100 positioned between the etched second silicon nitride film pattern 110a. This etching results the formation of a twice-etched second silicon nitride film pattern 110b, including a twice-etched nitride spacer 108b and a twice-etched first silicon nitride film pattern 105c capping the conductive film pattern 103, and an etched second insulation film 116a. Subsequently, a twice-etched nitride liner 112b remaining on the semiconductor substrate 100 is etched to form self-aligned contact holes 120.

More particularly, after a photoresist film is coated on the etched second insulation film 116a, the photoresist film is exposed and developed using a mask for forming a self-aligned contact hole, thereby forming a photoresist pattern (not shown) for opening a self-aligned contact region of the semiconductor substrate 100. The photoresist pattern has an open region and a mask region. The open region covers a space between the twice-etched second silicon nitride film pattern 110b and an edge portion of the upper surface of the twice-etched second silicon nitride film pattern 110b adjacent to the space. In addition, the mask region masks a portion of the upper surface of the twice-etched second silicon nitride film pattern 110b.

Subsequently, an anisotropic etching process for forming the self-aligned contact holes 120 is performed using the photoresist pattern as an etching mask to provide a high etching selectivity between silicon oxide and silicon nitride. The anisotropic etching process may be performed using a mixture of $CHF_3$, $CF_4$ and Ar. Using the anisotropic etching process, portions of the etched second insulation film 116a exposed in the open region of the photoresist pattern are primarily etched. When the portions of the etched second insulation film 116a are completely etched, portions of the twice-etched first insulation film 114b and the twice-etched second silicon nitride film pattern 110b are simultaneously exposed. Then, portions of the twice-etched first insulation film 114b are selectively etched to expose the nitride liner 112b positioned between the twice-etched second silicon nitride film patterns 110b. When the twice-etched first insulation film 114b is etched a third time, the twice-etched second silicon nitride film pattern 110b is etched slower than the twice-etched first insulation film 114b in accordance with the etching selectivity between the second silicon nitride film pattern 110 and the first insulation film 114.

Subsequently, the photoresist pattern is removed by an ashing process after contact holes 120 exposing the semiconductor substrate 100 are formed between the twice-etched second silicon nitride film pattern 110b by etching the exposed twice-etched nitride liner 112b. Thus, between adjacent twice-etched second silicon nitride film pattern 110b the first insulation film 114 is completely removed, and the etched second insulation film 116a and the twice-etched second silicon nitride film pattern 110b are exposed through sidewalls of the contact holes 120.

As described above, the twice-etched second silicon nitride film pattern 110b has a level upper surface and a height of the twice-etched second silicon nitride film pattern 110b is decreased by approximately 500 Å, thereby reducing the generation of process failures generated during the etching process.

Hereinafter, a reduction of the likelihood of process failures will be described in detail according to a shape of the twice-etched second silicon nitride film pattern 110b.

As a height of the twice-etched second silicon nitride film pattern 110b decreases, an etched thickness is also reduced due to the etching selectivity between silicon nitride and silicon oxide while the contact holes 120 are formed through the self-aligning process. As a result, the etched thickness of the twice-etched second silicon nitride film pattern 110b is reduced during the etching of the twice-etched first and the etched second insulation films 114b and 116a. Thus, a process failure, for example an exposure of the conductive film pattern 103 in the twice-etched second silicon nitride film pattern 110b, may be prevented as predetermined portions of the twice-etched second silicon nitride film pattern 110b are etched. In addition, another process failure, such as a contact non-opening, may be reduced in accordance with the reduction of the etched thickness during the self-aligning process.

Furthermore, the etching selectivity between the twice-etched second silicon nitride film pattern 110b and the twice-etched first and etched second insulation films 114b and 116a increases because the twice-etched second silicon nitride film pattern 110b has a level upper surface. Therefore, still another process failure, such as an over-etch of the twice-etched second silicon nitride film pattern 110b, may be prevented since the twice-etched second silicon nitride film pattern 110b is etched less when the etched first insulation film 114a is twice etched and the second insulation film 116 is first etched.

Figure 3A:
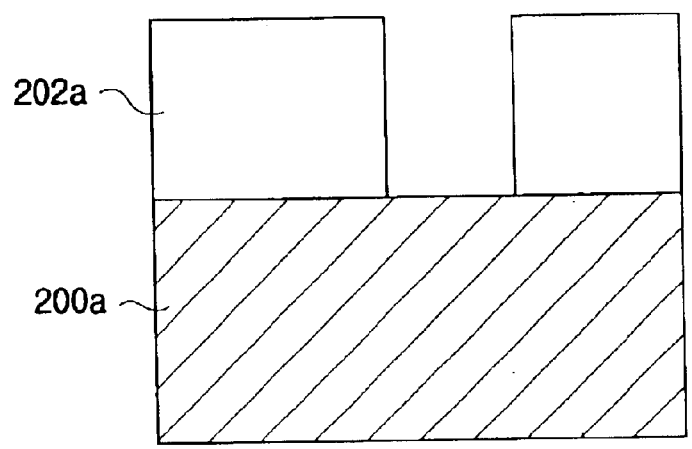
FIGS. 3A to 3C illustrate cross-sectional view views of structures depicting an etching selectivity of a structure including silicon oxide and silicon nitride under identical etching conditions.
Figure 3B:
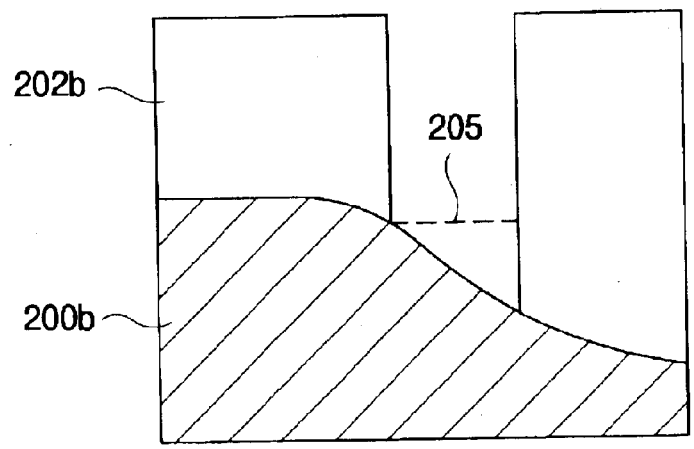
Figure 3C:
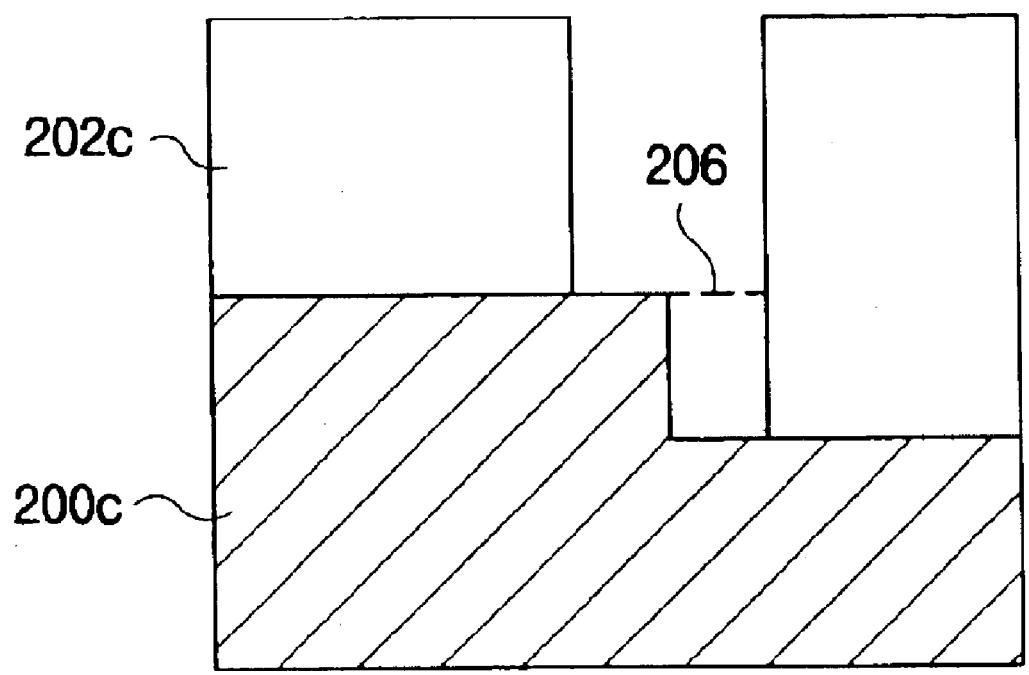

Though silicon oxide and silicon nitride may be etched under identical etching conditions, an etching selectivity between silicon oxide and silicon nitride may be generated depending on the structure including the silicon oxide and the silicon nitride. FIGS. 3A to 3C illustrate cross-sectional views of structures including silicon oxide and silicon nitride. The structures are etched to remove a portion of the silicon oxide so as to expose the silicon nitride.

FIG. 3A illustrates a structure including a silicon nitride layer, having a level upper surface, and a silicon oxide layer. FIG. 3B and FIG. 3C illustrate structures including a silicon nitride layer, having an uneven upper surface, and a silicon oxide layer.

It is experientially known that when a level silicon nitride film 200a and a level silicon oxide film 202a are formed on a substrate (not shown) as in FIG. 3A, an etching selectivity between the level silicon nitride film 200a and the level silicon oxide film 202a is higher than an etching selectivity between an uneven silicon nitride film 200b, 200c and a silicon oxide film 202b, 202c formed on the uneven silicon nitride film 200b, 200c, as may be seen in FIGS. 3B and 3C, respectively.

That is, when portions of the silicon oxide films 202b and 202c and the uneven silicon nitride films 200b and 200c, which are simultaneously exposed during an etching process, exist as shown in FIGS. 3B and 3C, the etching selectivity is lower as compared to a case in which one film between the silicon oxide film 202a and the silicon nitride film 200a is exposed only as shown in FIG. 3A. In addition, in the etching process, the etching selectivity is further reduced in accordance with a reduction of an exposed area of the silicon nitride films 200b and 200c at a location 205 of FIG. 3B and 206 of FIG. 3C when the silicon oxide films 202b and 202c and the silicon nitride films 200b and 200c are simultaneously exposed. More specifically, as shown in FIG. 3B, when the silicon nitride film 200b has an uneven surface, the exposed area of the silicon nitride film 200b is greatly reduced at location 205 when the silicon oxide film 202b and the silicon nitride film 200b are simultaneously exposed. On the other hand, as shown in FIG. 3C, when the silicon nitride film 200c has a level surface, the exposed area of the silicon nitride film 200c is relatively increased at location 206 when the silicon oxide film 202c and the silicon nitride film 200c are simultaneously exposed.

Figure 1C:
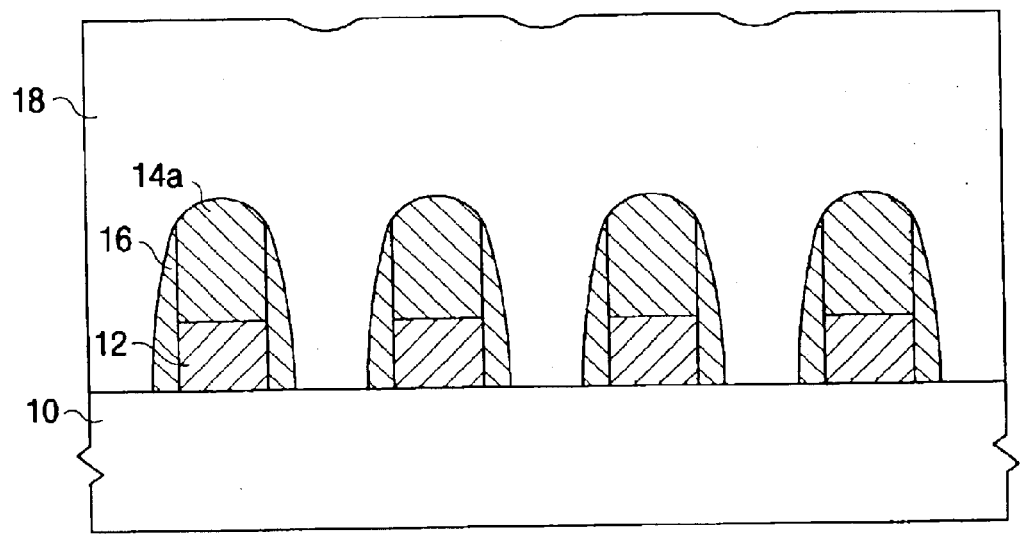
Figure 1D:
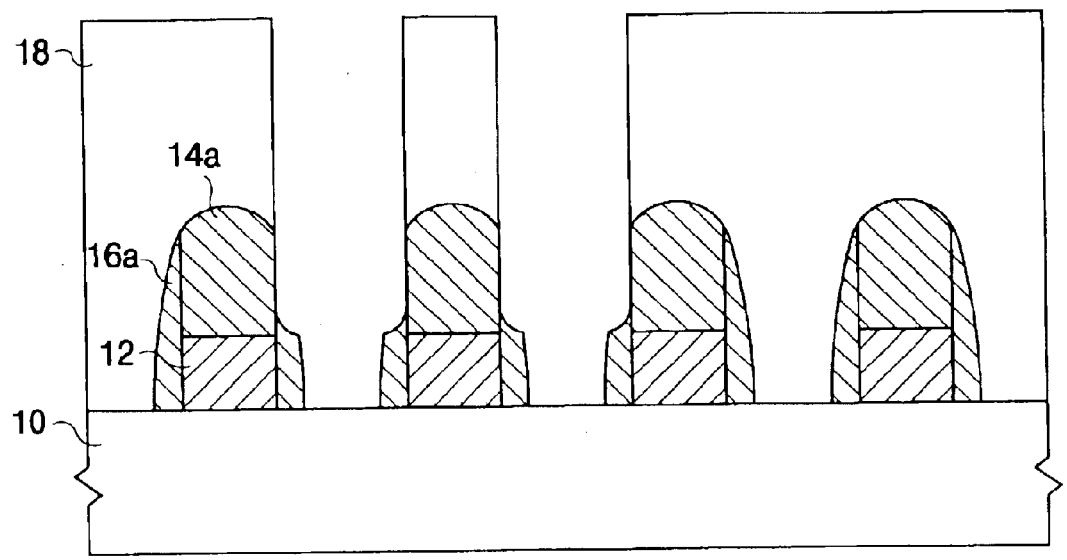
Figure 1E:
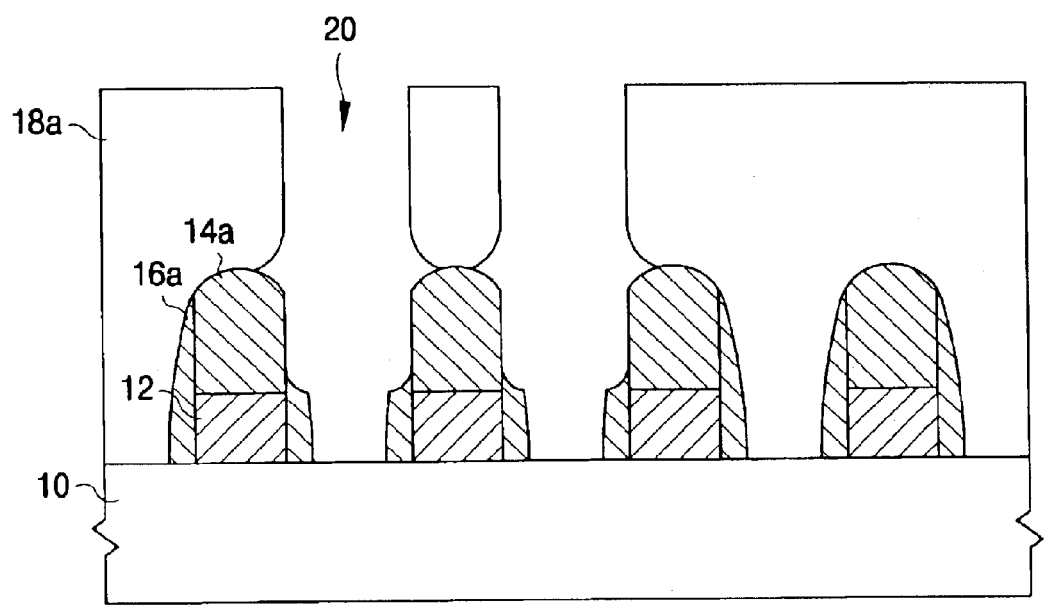

In a conventional method for forming a semiconductor device, because the upper surface of the second silicon nitride film pattern has a round shape, as may be seen in FIG. 1C, the exposed area of the second silicon nitride film pattern is relatively small at the location where the silicon oxide film and the second silicon nitride film pattern are simultaneously exposed during the etching process. Hence, the exposed second silicon nitride pattern is simultaneously and rapidly etched during the etching of the silicon oxide film. However, in the first embodiment of the present invention, the exposed area of the second silicon nitride pattern 110b is relatively wide at the location where the second silicon nitride pattern 110b and the insulation films 116a and 114b are simultaneously exposed during the etching process because the twice-etched second silicon nitride pattern 110b has a level upper surface. As a result, when the insulation films 116a and 114b are etched, the etching rate of the twice-etched second silicon nitride pattern 110b is slower than that in the conventional process. Thus, a process failure, such as an over-etch of the twice-etched second silicon nitride pattern 110b, may be prevented because the consumption of the etched second silicon nitride pattern 110a is reduced.

Referring back to FIG. 2G, the semiconductor substrate 100 including the contact holes is rinsed to remove polymers generated during the etching process, thereby forming self-aligned contact holes 120. The semiconductor substrate 100 is rinsed using a rinsing chemical. When the semiconductor substrate 100 is rinsed with the rinsing chemical, exposed films on the semiconductor substrate 100 are partially etched. In this case, the twice-etched first insulation film 114b is not exposed on the semiconductor substrate 100 through a bottom surface or sidewall of the contact hole 120. Thus, an etching failure of the twice-etched first insulation film 114b due to the rinsing chemical may be prevented.

The first insulation film 114 is comprised only of a material having a good reflow-ability to fill the gap between the gate structures, and such material includes atoms bonded with weak bonds. Hence, when the semiconductor substrate 100 is rinsed with the rinsing chemical, the first insulation film 114 is rapidly etched since the atoms in the surface of the first insulation film 114 rapidly react with the rinsing chemical. In a case that the first insulation film 114 is partially etched, the twice-etched first insulation film 114b between the contact holes 120 does not have a stable structure. In addition, a bridge failure may occur by connecting one gate structure to an adjacent gate structure through the contact hole 120 due to the partially removed twice-etched first insulation film 114b. However, in the first embodiment of the present invention, the twice-etched first insulation film 114b is not exposed through a bottom surface or a sidewall of the contact hole 120, only the etched second insulation film 116a, which is slowly etched against the rinsing chemical is exposed, so the above-mentioned problems may be prevented.

Figure 2H:
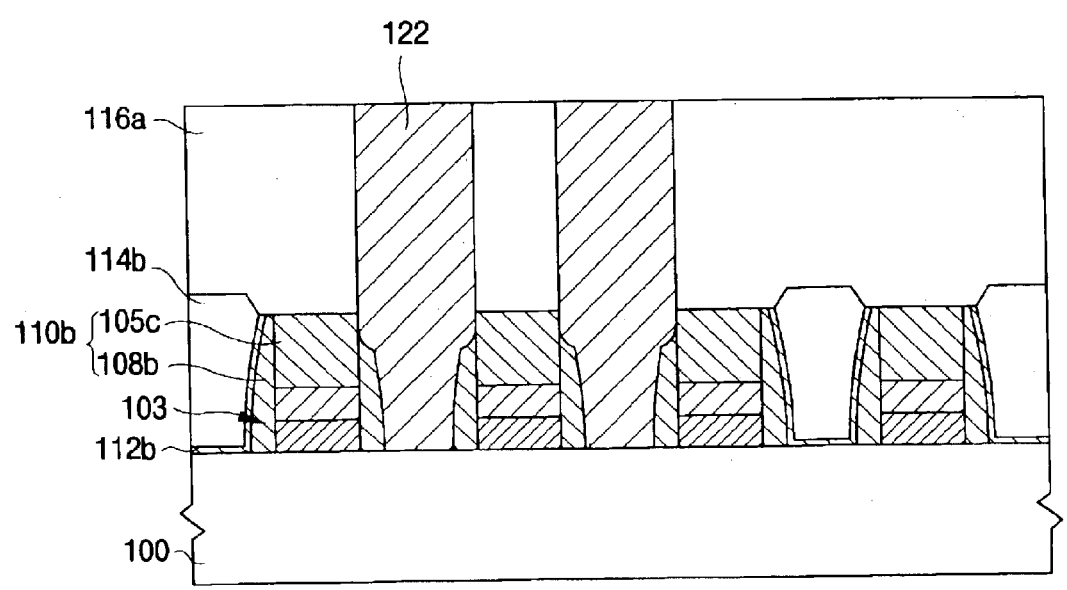

Referring to FIG. 2H, a conductive material is formed in the self-aligned contact hole 120 to form a contact 122.

According to the first embodiment of the present invention, process failures for forming a self-aligned contact hole may be prevented by utilizing an etching selectivity between silicon oxide and silicon nitride when the silicon nitride pattern enclosing the conductive film pattern has a level upper surface and a height of the silicon nitride pattern is reduced. In the first embodiment, any self-aligned contact hole positioned between adjacent conductive patterns may be formed using the above-described method even though an exemplary contact hole in the first embodiment is described as being formed between gate electrodes.

Second Embodiment

FIGS. 4A to 4E illustrate cross-sectional views of stages in a method for forming a self-aligned contact hole of a semiconductor device according to a second embodiment of the present invention. In FIGS. 4A to 4E, the same reference numerals are used for elements common to the first embodiment.

The second embodiment is distinct from the first embodiment in that height difference between a first insulation film and a silicon nitride pattern is not generated during a process for forming the silicon nitride pattern having a level upper surface by successively etching the first insulation film and the silicon nitride pattern.

Figure 4A:
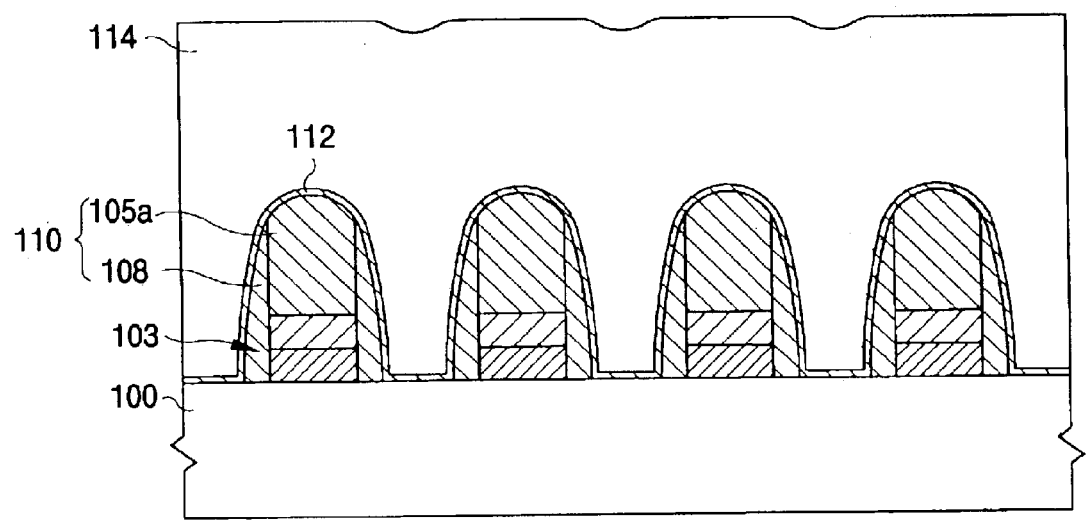
FIGS. 4A to 4E illustrate cross-sectional views of stages in a method for forming a self-aligned contact hole of a semiconductor device according to a second embodiment of the present invention.

Referring to FIG. 4A, a first insulation film 114 covering a second silicon nitride pattern 110 is formed in the same manner as described in connection with FIGS. 2A to 2D.

Figure 4B:
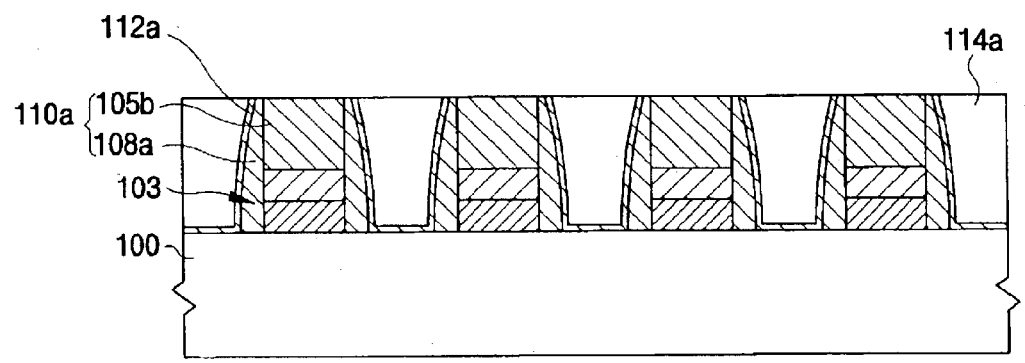

Referring to FIG. 4B, upper portions of the first insulation film 114 and the second silicon nitride pattern 110 are successively etched so that the etched second silicon nitride pattern 110a has a level upper surface. As a result of the successive etching in the second embodiment, which still may be a dry etching process or a chemical-mechanical process, no height difference is generated between the first insulation film 114 and the etched second silicon nitride pattern 110a. In the etching process, when the second silicon nitride pattern 110 is etched to have the level upper surface, the etched first insulation film 114a remains at a peripheral portion of the etched second silicon nitride pattern 110a exposed during the etching process so that the etched first insulation film 114a has a height identical to that of the etched second silicon nitride pattern 110a. Hence, because a side portion of the etched second silicon nitride pattern 110a is not exposed during the etching process, the side portion of the etched second silicon nitride pattern 110a is not etched, thereby securely protecting a conductive film pattern 103. With the etching process, a width of the upper surface of the second silicon nitride pattern 110a on the conductive film pattern 103 is at least wider than that of an upper surface of the conductive film pattern 103.

Figure 4C:
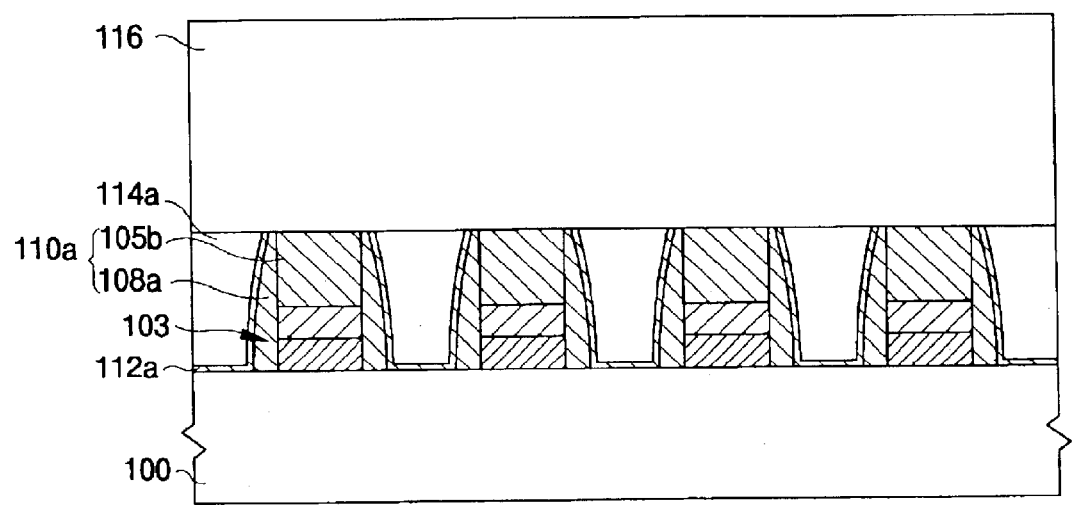

Referring to FIG. 4C, a second insulation film 116 is formed on the resultant structure including the etched second silicon nitride pattern 110a having the level upper surface. The second insulation film 116 is formed using a material including atoms more tightly bonded than the atoms of the first insulation film 114, so the second insulation film 116 is not readily consumed during successive processes.

Figure 4D:
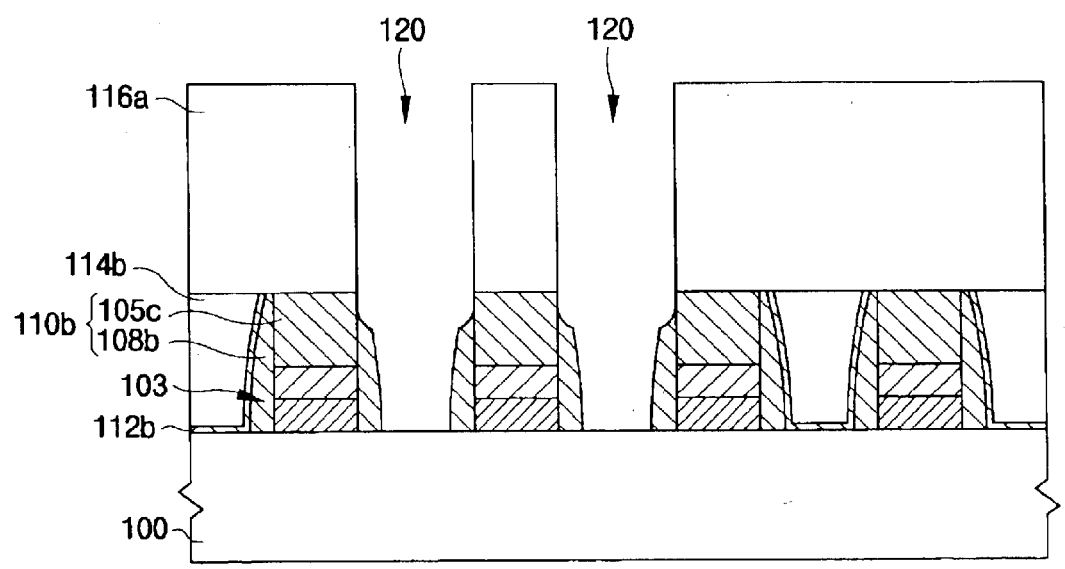

Referring to FIG. 4D, predetermined portions of the second insulation film 116 and the etched first insulation film 114 are etched to expose portions of a semiconductor substrate 100 between the twice-etched second silicon nitride patterns 110b. Then, the twice-etched nitride liner 112b formed on the semiconductor substrate 100 is etched to primarily form self-aligned contact holes 120.

Subsequently, the self-aligned contact holes 120 are completely formed after rinsing the semiconductor substrate 100 to remove polymers generated during the etching process. At that time, the twice-etched first insulation film 114b is not exposed through a bottom surface and a sidewall of the contact hole 120, so process failures due to an etch of the twice-etched first insulation film 114b with a rinsing chemical may be prevented.

Figure 4E:
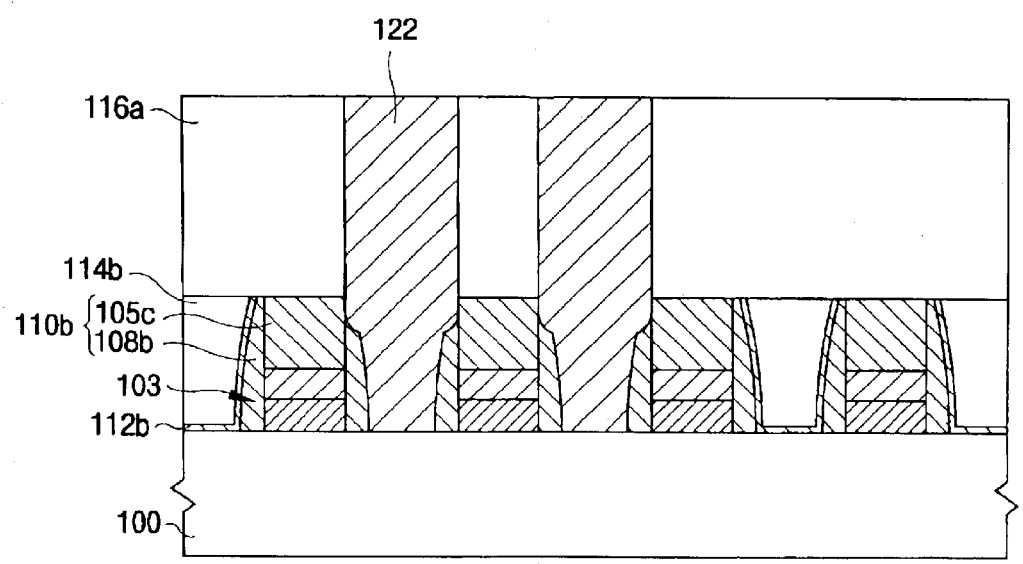

Referring to FIG. 4E, a contact 122 is formed by filling a conductive material in the self-aligned contact hole 120.

As described above, according to the present invention, process failures generated during a formation of a self-aligned contact hole may be prevented because a nitride pattern capping a conductive film pattern is not consumed. Therefore, a reliability of a semiconductor device may be enhanced and a yield of a manufacturing process for the semiconductor device may also be improved.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method for forming a self-aligned contact hole comprising:
    (a) forming a plurality of conductive structures on a semiconductor substrate, each conductive structure including a conductive film pattern having an upper and side surfaces and a protection pattern formed on the upper and side surfaces of the conductive film pattern;
    (b) forming a first insulation film to fill a space between adjacent conductive structures;
    (c) successively etching upper portions of the first insulation film and the protection patterns until each of the protection patterns has a level upper surface that is exposed;
    (d) forming a second insulation film on the resultant structure on the semiconductor substrate; and
    (e) selectively etching portions of the second insulation film and the first insulation film using a photolithography process to form the self-aligned contact hole exposing a portion of the semiconductor substrate between adjacent conductive structures.

2. The method for forming a self-aligned contact hole as claimed in claim 1, wherein the plurality of conductive film patterns comprise composite film patterns including polysilicon film patterns and metal silicide film patterns.

3. The method for forming a self-aligned contact hole as claimed in claim 1, wherein the first insulation film comprises an oxide having a good reflow-ability.

4. The method for forming a self-aligned contact hole as claimed in claim 1, wherein the first insulation film is formed of a material selected from the group consisting of boro-phosphor silicate glass (BPSG), undoped silicate glass (USG) or spin-on glass (SOG).

5. The method for forming a self-aligned contact hole as claimed in claim 1, wherein the second insulation film is formed of a material comprising atoms having tighter bonds than the atoms of the first insulation film.

6. The method for forming a self-aligned contact hole as claimed in claim 1, wherein the second insulation film comprises an oxide that is etched by a rinsing chemical more slowly than the first insulation film.

7. The method for forming a self-aligned contact hole as claimed in claim 1, wherein the second insulation film is formed by a high density plasma chemical vapor deposition process or a plasma-enhanced chemical vapor deposition process.

8. The method for forming a self-aligned contact hole as claimed in claim 1, wherein the first insulation film and the second insulation film are formed using different materials.

9. The method for forming a self-aligned contact hole as claimed in claim 1, wherein the first insulation film and the second insulation film are formed through different processes.

10. The method for forming a self-aligned contact hole as claimed in claim 1, wherein the first insulation film is formed of boro-phosphor silicate glass (BPSG) and the second insulation film is formed of BPSG including boron (B) and phosphorus (P) ion concentrations lower than the concentrations of boron and phosphorous in the first insulation film.

11. The method for forming a self-aligned contact hole as claimed in claim 1, wherein the protection pattern comprises a material having an etching selectivity with respect to the first insulation film and the second insulation film.

12. The method for forming a self-aligned contact hole as claimed in claim 1, wherein the protection pattern comprises silicon nitride.

13. The method for forming a self-aligned contact hole as claimed in claim 1, wherein each of the plurality of conductive structures has a thickness that is greater than approximately 4,000 Å.

14. The method for forming a self-aligned contact hole as claimed in claim 1, wherein a space between adjacent conductive structures is less than approximately 1,500 Å.

15. The method for forming a self-aligned contact hole as claimed in claim 1, wherein a width of each of the conductive film patterns is less than approximately 2,500 Å.

16. The method for forming a self-aligned contact hole as claimed in claim 1, wherein a width of the exposed upper surface of the protection pattern is at least equal to or wider than a width of an upper surface of the conductive film patterns.

17. The method for forming a self-aligned contact hole as claimed in claim 1, wherein the successive etching is performed using a dry etching process or a chemical-mechanical polishing process.

18. The method for forming a self-aligned contact hole as claimed in claim 1, wherein during the successive etching, the first insulation film is etched slower than the protection pattern so that a portion of the first insulation film filled between adjacent conductive structures protrudes from the upper surface of the conductive structures.

19. The method for forming a self-aligned contact hole as claimed in claim 18, wherein during the successive etching, an etching ratio between the first insulation film and the protection pattern is about 1:1–1:1.5.

20. The method for forming a self-aligned contact hole as claimed in claim 14, wherein the successive etching is performed by a chemical-mechanical polishing process using a slurry to etch the first insulation film slower than the protection pattern.

21. The method for forming a self-aligned contact hole as claimed in claim 14, wherein the successive etching is performed by a dry etching process using an etching gas for etching the first insulation film slower than the protection pattern.

22. The method for forming a self-aligned contact hole as claimed in claim 1, further comprising rinsing the semiconductor substrate with a rinsing chemical to remove polymers generated during the etching performed in (e).

23. The method for forming a self-aligned contact hole as claimed in claim 1, wherein the photolithography process in the selectively etching of the first and second insulation films is performed using a mask pattern including an open region covering a region between the conductive structures and an upper surface portion of the level upper surface of the protection pattern.

24. The method for forming a self-aligned contact hole as claimed in claim 1, wherein the selective etching of the first and second insulation films is performed using an anisotropic etching.

25. The method for forming a self-aligned contact hole as claimed in claim 24, wherein the anisotropic etching is performed using a mixture of $CHF_3$, $CF_4$ and Ar.

26. The method for forming a self-aligned contact hole as claimed in claim 1, wherein forming a plurality of conductive patterns comprises:

forming a conductive film and a first nitride film on the semiconductor substrate;

forming the plurality of conductive structures, each including the conductive film pattern and the protection pattern by etching portions of the conductive film and the first nitride film to expose portions of the semiconductor substrate between adjacent conductive structures;

forming a second nitride film having a uniform thickness on the plurality of conductive structures and on the exposed portions of the semiconductor substrate; and forming the protection film patterns including the first and second nitride films on upper and side surfaces of the plurality of conductive film patterns by anisotropically etching the second nitride film to remove a portion of the second nitride film formed on the semiconductor substrate.

27. The method for forming a self-aligned contact hole as claimed in claim 1, further comprising forming a nitride liner on the plurality of conductive structures and on the semiconductor substrate after forming the plurality of conductive structures.

28. The method for forming a self-aligned contact hole as claimed in claim 1, wherein the successive etching is performed until more than approximately 500 Å of the protection pattern is etched.

29. The method for forming a self-aligned contact hole as claimed in claim 1, further comprising:

forming a conductive material in the self-aligned contact hole to form a contact.

* * * * *